(12) United States Patent
Matsushima et al.

(10) Patent No.: US 10,427,949 B2
(45) Date of Patent: Oct. 1, 2019

(54) ALUMINA SINTERED BODY AND BASE SUBSTRATE FOR OPTICAL DEVICE

(71) Applicant: NGK INSULATORS, LTD., Nagoya (JP)

(72) Inventors: Kiyoshi Matsushima, Nagoya (JP); Morimichi Watanabe, Nagoya (JP); Kei Sato, Tokai (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/909,002

(22) Filed: Mar. 1, 2018

(65) Prior Publication Data

US 2018/0230020 A1    Aug. 16, 2018

Related U.S. Application Data

(63) Continuation of application No. PCT/JP2016/078788, filed on Sep. 29, 2016.

(30) Foreign Application Priority Data

Sep. 30, 2015 (JP) .................. 2015-193943

(51) Int. Cl.
| | | |
|---|---|---|
| *C01F 7/00* | (2006.01) | |
| *C01F 7/02* | (2006.01) | |
| *C04B 35/115* | (2006.01) | |
| *G02B 1/02* | (2006.01) | |
| *C04B 35/632* | (2006.01) | |
| *C04B 35/634* | (2006.01) | |
| *C04B 35/638* | (2006.01) | |
| *C04B 35/645* | (2006.01) | |
| *H01L 33/00* | (2010.01) | |

(52) U.S. Cl.
CPC .............. *C01F 7/02* (2013.01); *C04B 35/115* (2013.01); *C04B 35/632* (2013.01); *C04B 35/638* (2013.01); *C04B 35/6342* (2013.01); *C04B 35/645* (2013.01); *G02B 1/02* (2013.01); *C01P 2002/60* (2013.01); *C01P 2002/72* (2013.01); *C01P 2002/80* (2013.01); *C01P 2004/02* (2013.01); *C01P 2006/16* (2013.01); *C04B 2235/3206* (2013.01); *C04B 2235/5292* (2013.01); *C04B 2235/5296* (2013.01); *C04B 2235/5436* (2013.01); *C04B 2235/5445* (2013.01); *C04B 2235/5472* (2013.01); *C04B 2235/6025* (2013.01); *C04B 2235/6567* (2013.01); *C04B 2235/6586* (2013.01); *C04B 2235/72* (2013.01); *C04B 2235/724* (2013.01); *C04B 2235/786* (2013.01); *C04B 2235/787* (2013.01); *H01L 33/007* (2013.01); *H01L 33/0087* (2013.01)

(58) Field of Classification Search
CPC ........ C01P 2002/60; C01P 2002/70–78; C01P 2002/89; C01P 2006/16; C01P 2006/17; C01P 2004/01–04; C04B 35/111; C04B 35/115; C01F 7/02; G02B 1/02
USPC ......................................................... 423/625
See application file for complete search history.

(56) References Cited

U.S. PATENT DOCUMENTS

| | | | | |
|---|---|---|---|---|
| 5,549,746 A | * | 8/1996 | Scott ..................... | C30B 29/20 117/4 |
| 10,138,166 B2 | * | 11/2018 | Matsushima .......... | C04B 35/115 |
| 2011/0039685 A1 | | 2/2011 | Mao et al. | |
| 2011/0059839 A1 | * | 3/2011 | Miyazawa ............ | C04B 35/115 501/152 |
| 2013/0065067 A1 | * | 3/2013 | Nishimura ............ | C04B 35/111 428/446 |
| 2015/0144956 A1 | * | 5/2015 | Watanabe ............. | H01L 33/32 257/76 |
| 2015/0179504 A1 | * | 6/2015 | Ide ...................... | H01L 21/76251 257/506 |
| 2018/0179665 A1 | * | 6/2018 | Watanabe ............. | C04B 35/111 |
| 2018/0230020 A1 | * | 8/2018 | Matsushima .......... | C04B 35/115 |

FOREIGN PATENT DOCUMENTS

| | | |
|---|---|---|
| JP | 2011-100717 A1 | 5/2011 |
| JP | 5651278 B1 | 1/2015 |

OTHER PUBLICATIONS

Hailan Yi et al, "Crystal Plane Evolution of Grain Oriented Alumina Ceramics with High Transparency," *Ceramics International*, 38 (2012), pp. 5557-5561.
Ryoichi Furushima et al., "Fabrication of Highly Particle-Oriented Alumina Green Compact from Non-Aqueous Slurry," *Journal of the Ceramics Society of Japan*, vol. 119, No. 3 (2011), pp. 198-202.
Norimasa Nishiyama, et al., "Transparent Nanocrystalline Bulk Alumina Obtained at 7.7 GPa and 800° C.," *Scripta Materialia*, vol. 69 (2013), pp. 362-365.
International Search Report and Written Opinion (Application No. PCT/JP2016/078788) dated Nov. 15, 2016.
English translation of International Preliminary Report on Patentability (Chapter 1) (Application No. PCT/JP2016/078788) dated Apr. 12, 2018, 7 pages.

* cited by examiner

*Primary Examiner* — Steven J Bos
(74) *Attorney, Agent, or Firm* — Burr & Brown, PLLC

(57) ABSTRACT

An alumina sintered body of the present invention has a degree of c-plane orientation of 5% or more, which is determined by a Lotgering method using an X-ray diffraction profile in a range of $2\theta=20°$ to $70°$ obtained under X-ray irradiation, and an XRC half width of $15.0°$ or less in rocking curve measurement, an F content of less than 0.99 mass ppm when measured by D-SIMS, a crystal grain diameter of 15 to 200 μm, and 25 or less pores having a diameter of 0.2 μm to 1.0 μm when a photograph of a viewing area 370.0 μm in a vertical direction and 372.0 μm in a horizontal direction taken at a magnification factor of 1000 is visually observed.

10 Claims, 4 Drawing Sheets

ALUMINA SINTERED BODY AND BASE SUBSTRATE FOR OPTICAL DEVICE

BACKGROUND OF THE INVENTION

1. Field of the Invention

The present invention relates to an alumina sintered body and a base substrate for optical device.

2. Description of the Related Art

Transparent alumina sintered bodies are known heretofore. For example, in NPL 1, slip casting is performed in a magnetic field to an alumina suspension to which MgO is added, and the resulting product is sintered in vacuum at 1850° C. for 5 hours so as to prepare a transparent alumina sintered body having oriented grains. For example, an alumina sintered body prepared by applying a 12 tesla magnetic field has an in-line transmittance of 70.3% at a wavelength of 600 nm, and the degree of orientation is as high as 97%. Moreover, an alumina sintered body prepared by applying an 8 tesla magnetic field has an in-line transmittance of about 56% at a wavelength of 600 nm, and the degree of orientation is as high as 78%. As the magnetic field decreases to 6 tesla and to 4 tesla, the in-line transmittance and the degree of orientation also decrease. It is concluded from these results that the in-line transmittance and the degree of orientation increase with the increase in the strength of the magnetic field.

CITATION LIST

Non Patent Literature

NPL 1: Ceramics International vol. 38, pp 5557-5561 (2012)

SUMMARY OF THE INVENTION

However, in NPL 1, the degree of orientation was not high enough and an alumina sintered body having an in-line transmittance of 50% or higher could not be obtained unless a magnetic field as strong as 12 tesla was applied. The apparatus that performs slip casting while applying such a strong magnetic field exists only in limited facilities at the present time. In addition, the obtained sintered body has a large number of pores.

The present invention has been made to address such challenges, and a main object is to provide an alumina sintered body that has a high in-line transmittance and excellent transparency.

An alumina sintered body of the present invention has a degree of c-plane orientation of 5% or more, which is determined by a Lotgering method using an X-ray diffraction profile in a range of $2\theta=20°$ to $70°$ obtained under X-ray irradiation, and an XRC half width of $15.0°$ or less in rocking curve measurement, an F content of less than 0.99 mass ppm when measured by dynamic secondary ion mass spectroscopy (D-SIMS), a crystal grain diameter of 15 to 200 μm, and 25 or less pores having a diameter of 0.2 μm to 1.0 μm when a photograph of a viewing area 370.0 μm in a vertical direction and 372.0 μm in a horizontal direction taken at a magnification factor of 1000 is visually observed. The alumina sintered body of the present invention has a high in-line transmittance and excellent transparency even when the degree of orientation is not sufficiently high.

Although the reason behind achieving such excellent transparency is not clear, it is presumed that the degree of c-plane orientation, the XRC half width, the F content, the crystal grain diameter, and the number of pores having a diameter of 0.2 to 1.0 μm all have taken appropriate values and contributed to the result when combined.

A base substrate for optical device of the present invention is a substrate formed of the alumina sintered body of the present invention described above. Examples of the optical device include an LED, an LD, a solar cell, a sensor, a photodiode, an optical member, and a window material.

BRIEF DESCRIPTION OF THE DRAWINGS

FIG. 2A is a plan view, and FIG. 2B is a front view.

DETAILED DESCRIPTION OF THE INVENTION

Figure 1:
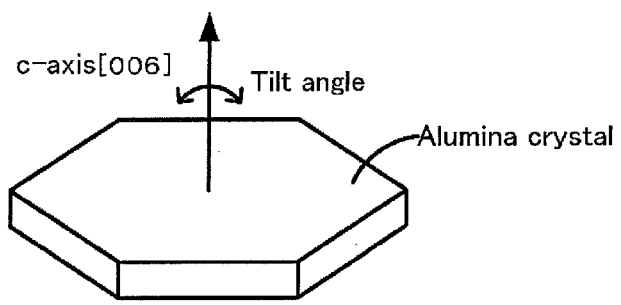
FIG. 1 is a diagram illustrating a tilt angle.

An alumina sintered body of the present invention has a degree of c-plane orientation of 5% or more, which is determined by a Lotgering method using an X-ray diffraction profile in a range of $2\theta=20°$ to $70°$ obtained under X-ray irradiation, and an XRC half width of $15.0°$ or less in rocking curve measurement, an F content of less than 0.99 mass ppm when measured by D-SIMS, a crystal grain diameter of 15 to 200 μm, and 25 or less pores having a diameter of 0.2 μm to 1.0 μm when a photograph of a viewing area 370.0 μm in a vertical direction and 372.0 μm in a horizontal direction taken at a magnification factor of 1000 is visually observed.

The degree of c-plane orientation is determined by polishing a particular section (for example, a section parallel to the c-plane) of an alumina sintered body by using an XRD system (for example, RINT-TTR III produced by Rigaku Corporation) to obtain a flat and smooth surface, irradiating the surface with an X-ray so as to obtain an X-ray diffraction profile in the range of $2\theta=20°$ to $70°$, and calculating the degree of c-plane orientation from the profile by using the equations described below. The c-plane is a (006) plane of alumina. In the equations, P is a value obtained by XRD of the alumina sintered body of the present invention, and $P_0$ is a value calculated from the standard α-alumina (JCPDS, card No. 46-1212). The alumina sintered body of the present invention is an alumina sintered body having a degree of c-plane orientation of 5% or more. The degree of c-plane orientation is to be 5% or more, preferably 10% or more, more preferably 20% or more, yet more preferably 60% or more, still more preferably 80% or more, more preferably 90% or more, and particularly preferably 96% or more.

As indicated by JCPDS, card No. 46-1212, the diffraction intensity of the (006) plane, i.e., the c-plane, of alumina is relatively low compared to intensities of other index planes; thus, the degree of c-plane orientation determined by the Lotgering method tends to be low although the grains are oriented to some extent. Therefore, a degree of c-plane orientation of 5% indicates a highly oriented state. For example, a publicized monograph (Journal of the Ceramics Society of Japan, pp 198-202 (2011)) describes that the degree of c-plane orientation of an alumina compact determined by the Lotgering method is significantly lower than the actual degree of orientation (the proportion of the oriented grains). According to Table 2 of this monograph, when the degree of c-plane orientation of an alumina compact determined by the Lotgering method is 2.4%, the proportion of the c-plane-oriented grains calculated by measuring birefringence is 69%. Thus, when the degree of c-plane orientation of the alumina sintered body of the present invention determined by the Lotgering method is 5%, at least 70% or more of the sintered grains are considered to be c-plane oriented.

$$\text{Degree of } c\text{-plane orientation [\%]} = \frac{p - p_0}{1 - p_0} \times 100 \quad \text{[Math. 1]}$$

$$p_0 = \frac{I_0(006)}{\sum I_0(hkl)}$$

$$p = \frac{I_s(006)}{\sum I_s(hkl)}$$

The XRC half width is a half width (XRC·FWHM) of an X-ray rocking curve obtained by measuring a surface of an alumina substrate by an X-ray rocking curve method (omega scanning). XRC·FWHM is an index for evaluating the slope (tilt angle) of a crystal axis of each alumina grain and the orientation axis (for example, the c-axis) of an alumina sintered body, and the inventors of the present invention have found that transparency is improved by decreasing the tilt angle. FIG. 1 is a schematic diagram illustrating the tilt angle. From the viewpoint of transparency, the tilt angle is preferably small. XRC·FWHM is to be 15.0° or less, preferably 10.0° or less, more preferably 8.0° or less, more preferably 5.0° or less, yet more preferably 3.2° or less, particularly preferably 2.6° or less, and yet preferably 1.0° or less.

The F content measured by the D-SIMS is preferably less than 0.99 mass ppm, preferably 0.90 mass ppm or less, and more preferably equal to or less than the detection limit (0.1 mass ppm). The Mg content is measured by inductively coupled plasma (ICP) emission spectrometry. The Mg content is preferably 5000 mass ppm or less, more preferably 3000 mass ppm or less, yet more preferably 1000 mass ppm or less, particularly preferably 500 mass ppm or less, and yet more preferably 350 ppm mass or less. The Mg content is preferably 20 mass ppm or more. Examples of the form of Mg added include MgO, MgF$_2$, and MgNO$_3$. The contents of impurity elements other than Al, O, Mg, C, and F are preferably each 10 mass ppm or less. Regarding C, the content is preferably 100 mass ppm or less, more preferably 70 mass ppm or less, and yet more preferably 50 mass ppm or less. For measuring these contents, for example, a firing (high-frequency heating)-infrared absorption spectroscopy can be used for C and S, an inert gas fusion-thermal conductivity method can be used for N, an inert gas fusion-nondispersive infrared absorption spectroscopy can be used for H, and the ICP emission spectrometry can be used for other elements (mainly Si, Fe, Ti, Na, Ca, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu).

The crystal grain diameter is the average of the sintered grain diameters. The crystal grain diameter is assumed to be a value obtained by thermally etching a particular mirror-polished section (for example, a section parallel to the c-plane) of an alumina sintered body, then photographing an image of that section, setting a rectangular viewing area range in the obtained image, measuring all grains that intersect with two diagonal lines drawn in the rectangular viewing area range so as to determine the length of a segment on the inner side of each grain, and multiplying the average of the obtained lengths by 1.5. The crystal grain diameter is to be 15 to 200 µm, preferably 20 to 200 µm, more preferably 25 to 100 µm, more preferably 40 to 100 µm, and yet more preferably 45 to 95 µm.

The number of pores having a diameter of 0.2 to 1.0 µm (in other words, a diameter of 0.2 µm or more and 1.0 µm or less) is counted as follows. That is, after any desired section of the alumina sintered body of the present invention is polished by ion milling, the polished section is magnified 1000 times with a scanning electron microscope; then, twelve photographs, each with a viewing area 92.5 µm in a vertical direction and 124.0 µm in a horizontal direction, are taken so that the photographs form a continuous image having a length equal to a total of four photographs in the vertical direction and a width equal to a total of three photographs in the horizontal direction (370.0 µm in the vertical direction and 372.0 µm in the horizontal direction); and the number of pores having a diameter of 0.2 to 1.0 µm in these twelve photographs is counted by visual observation. Polishing is conducted by ion milling because grains do not detach from the section. An example of the polisher that employs ion milling is a cross section polisher produced by JEOL Ltd. In a photograph magnified by 1000 times, pores appear as black dots, and pore sizes with a diameter of 0.2 to 1.0 µm can be sufficiently recognized by visual observation. The number of pores is to be 25 or less, preferably 15 or less, more preferably 10 or less, more preferably 7 or less, yet more preferably 5 or less, and particularly preferably 2 or less.

According to the alumina sintered body of the present invention, the in-line transmittance at a wavelength of 300 to 1000 nm of a sample having a thickness of 0.5 mm taken from the alumina sintered body takes a high value (for example 50% or more). The in-line transmittance can be measured with a spectrophotometer (for example, Lambda 900 produced by PerkinElmer Inc.). When the thickness of the sample is to be converted into a different thickness, the following conversion formula may be used. This formula is cited from Scripta Materialia vol. 69, pp 362-365 (2013). In the formula, T1 is an actual measured value of the in-line transmittance, T2 is an in-line transmittance after conversion, t1 is an actually measured value of the thickness, t2 is a thickness after conversion, and R is a surface reflectance inherent to the material (0.14 for alumina). The in-line transmittance is preferably 55% or more, more preferably 60% or more, and yet more preferably 70% or more.

$$T2=(1-R)(T1/(1-R))^{(t2/t1)}$$

The alumina sintered body of the present invention preferably has a degree of c-plane orientation of 5% or more, an XRC half width of 15.0° or less, an F content equal to or lower than the detection limit (equal to or lower than 0.1 mass ppm), a crystal grain diameter of 20 to 200 µm, and 10 or less pores, since transparency is enhanced. In other words, when a sample having a thickness of 0.5 mm is taken from such an alumina sintered body and the in-line transmittance at a wavelength of 300 to 1000 nm is measured, the measured value is 55% or more.

The alumina sintered body of the present invention preferably has a degree of c-plane orientation of 60% or more, an XRC half width of 5.0° or less, an F content equal to or lower than the detection limit, a crystal grain diameter of 40 to 95 µm, and 7 or less pores, since transparency is enhanced. In other words, when a sample having a thickness of 0.5 mm is taken from such an alumina sintered body and the in-line transmittance at a wavelength of 300 to 1000 nm is measured, the measured value is 60% or more.

The alumina sintered body of the present invention preferably has a degree of c-plane orientation of 60% or more, an XRC half width of 5.0° or less, an F content equal to or lower than the detection limit, a crystal grain diameter of 45 to 95 µm, and 5 or less pores, since transparency is further enhanced. In other words, when a sample having a thickness of 0.5 mm is taken from such an alumina sintered body and the in-line transmittance at a wavelength of 300 to 1000 nm is measured, the measured value is 70% or more.

The alumina sintered body of the present invention preferably has a degree of c-plane orientation of 96% or more, an XRC half width of 2.6° or less, an F content equal to or lower than the detection limit, a crystal grain diameter of 45 to 95 µm, and 3 or less pores, since transparency is further enhanced.

The alumina sintered body of the present invention can be used as a base substrate for forming a film, and, for example, can be used as a base substrate for forming films of GaN, ZnO, AlN, SiC, InN, etc. The alumina sintered body of the present invention is preferably surface-polished before forming films. In this manner, irregularities on the surfaces are eliminated, film formation is smooth, and defects rarely occur in the films.

The alumina sintered body of the present invention can be produced by: preparing an alumina raw material powder containing a plate-like alumina powder having an aspect ratio of 3 or more and a fine alumina powder having an average particle diameter smaller than that of the plate-like alumina powder so that T in a mixing ratio T:(100−T) of the plate-like alumina powder to the fine alumina powder in terms of mass ratio is 0.001 or more and less than 1; forming a forming raw material containing the alumina raw material powder into a compact; and sintering the compact.

Figure 2A:
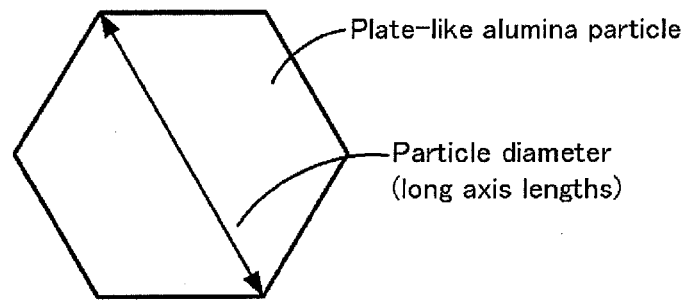
FIGS. 2A and 2B include schematic diagrams of a plate-like alumina particle.
Figure 2B:
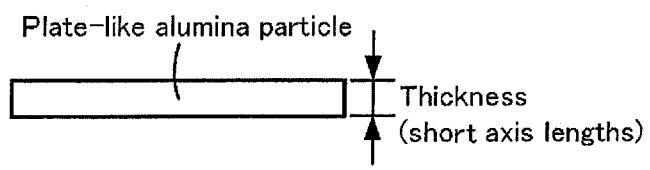

The aspect ratio of the plate-like alumina powder is average particle diameter/average thickness. Here, the average particle diameter is the average of the long axis lengths of the particle plate surfaces, and the average thickness is the average of the short axis lengths of the particles. These values are determined by observing arbitrarily selected one hundred particles in the plate-like alumina powder with a scanning electron microscope (SEM). FIGS. 2A and 2B include schematic diagrams of a plate-like alumina particle, FIG. 2A is a plan view, and FIG. 2B is a front view. The plate-like alumina particle has a substantially hexagonal shape when viewed in plan, the particle diameter thereof is as illustrated in FIG. 2A, and the thickness thereof is as illustrated in FIG. 2B. By using the alumina raw material powder containing a plate-like alumina powder having an aspect ratio of 3 or more, the degree of orientation of the final product, alumina sintered body is increased. The average particle diameter of the plate-like alumina powder is preferably large from the viewpoint of increasing the degree of orientation, and is preferably 1.5 µm or more, more preferably 5 µm or more, yet more preferably 10 µm or more, and particularly preferably 15 µm or more. However, from the viewpoint of densification, the average particle diameter is preferably small and is preferably 30 µm or less. In view of the above, in order to achieve both a high degree of orientation and densification, the average particle diameter is preferably 1.5 µm to 20 µm.

Figure 3:
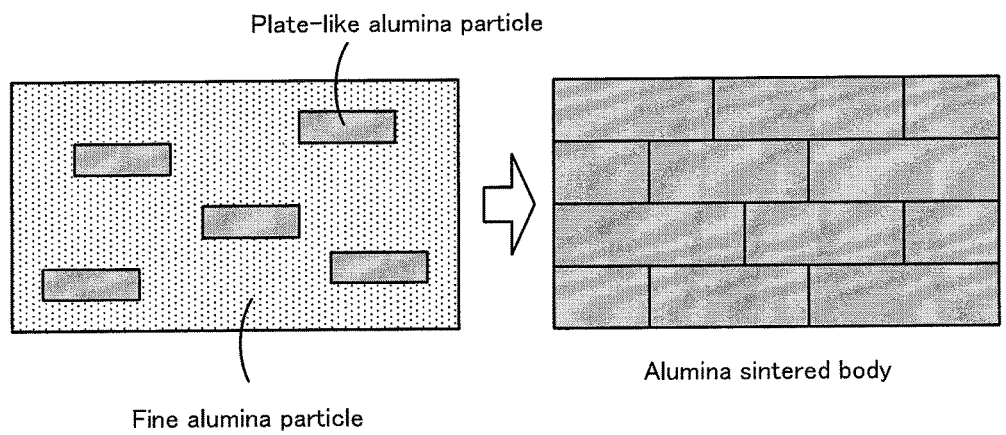
FIG. 3 is a schematic diagram of a step of preparing an alumina sintered body by a TGG method.

The F content of the mixed powder before forming is preferably set so that the F content in the alumina sintered body after sintering is less than 0.99 mass ppm, more preferably 0.90 mass ppm or less, and yet more preferably substantially zero (equal to or smaller than the detection limit). By forming the mixed powder containing the plate-like alumina powder and the fine alumina powder, the plate-like particles become smoothly oriented during forming (tape casting, extrusion forming, cast forming, injection molding, uniaxial press forming, etc.). Moreover, during sintering, the plate-like alumina powder serves as seed crystals (templates) and the fine alumina powder serves as a matrix so that the templates undergo homoepitaxial growth while taking in the matrix. This production method is called a templated grain growth (TGG) method. FIG. 3 is a schematic diagram of a step of preparing an alumina sintered body by a TGG method. According to the TGG method, the microstructure of the alumina sintered body to be obtained can be controlled by the particle diameters and the mixing ratio of the plate-like alumina powder and the fine alumina powder, and, compared to when a plate-like alumina powder alone is sintered, densification is smooth and the degree of orientation is easily improved.

The sintering temperature (highest attained temperature) during sintering of the compact is preferably 1800° C. or higher, more preferably 1850° C. or higher, yet more preferably 1850 to 2050° C., and still more preferably 1900 to 2000° C. In addition, the sintering method is preferably pressure-sintering. Examples of the pressure-sintering include hot press sintering, HIP sintering, and spark plasma sintering (SPS). Prior to pressure-sintering, pressureless pre-sintering may be performed. In performing HIP sintering, a capsule method may be employed. The pressure in the case where hot press sintering is employed is preferably 50 kgf/cm² or more and more preferably 200 kgf/cm² or more. The pressure in the case where HIP sintering is employed is preferably 1000 kgf/cm² or more and more preferably 2000 kgf/cm² or more. The sintering atmosphere is not particularly limited but is preferably one of an air atmosphere, a nitrogen atmosphere, an inert gas, such as Ar, atmosphere, and a vacuum atmosphere, is particularly preferably a nitrogen atmosphere or an Ar atmosphere, and most preferably a nitrogen atmosphere. The reason why the nitrogen atmosphere is preferable is not clear, but high transparency is obtained. When the temperature is being decreased from the highest attained temperature during sintering, depressurization may be immediately performed or depressurization may be performed after applying a pressing pressure of 50 kgf/cm² or more until a particular temperature (a temperature set within the range of 1000 to 1400° C. (preferably 1100 to 1300° C.)) is reached.

A base substrate for optical device of the present invention is a substrate formed of the alumina sintered body of the present invention described above. Examples of the optical device include a light-emitting device and a light-receiving device. For example, when a GaN layer is formed on the base substrate for optical device of the present invention, the base substrate can be used as a light-emitting substrate, such as an LED, that is larger in size and less expensive than when sapphire is used as a base substrate. Since the base substrate for optical device of the present invention is transparent, the substrate can be removed by laser lift-off. Moreover, when the base substrate is left unremoved, light can be output from the base substrate side also. Note that in addition to the GaN layer, a ZnO layer, an AlN layer, an InN layer, etc., can also be formed.

Figure 4:
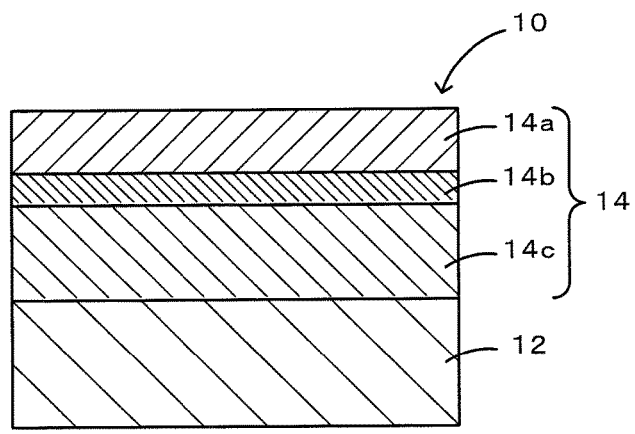
FIG. 4 is a schematic cross-sectional view of a light-emitting device 10.

Examples of using the base substrate for optical device of the present invention in a light-emitting device are described below. As illustrated in FIG. 4, a light-emitting device 10 includes a base substrate 12 and a light-emitting functional layer 14 formed on the base substrate 12. The light-emitting functional layer 14 emits light on the basis of the light-emitting principle of LEDs when voltage is applied; in this example, an n-type layer 14c, an active layer 14b, and a p-type layer 14a are stacked in that order from the side close to the base substrate 12. The light-emitting functional layer 14 is formed of a GaN-based material, a ZnO-based material, an AlN-based material, or the like.

Figure 5:
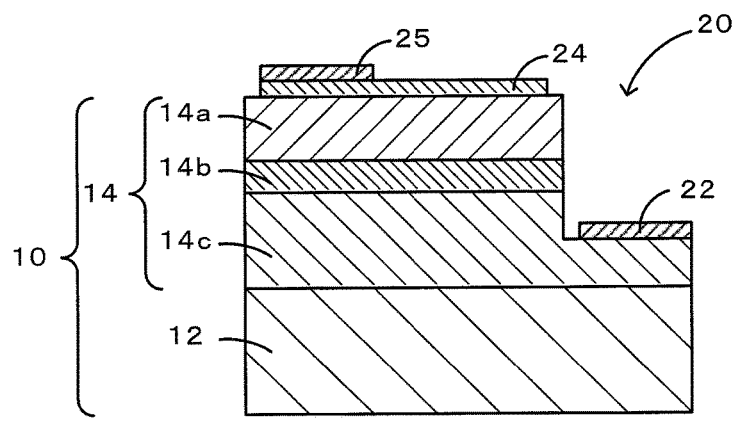
FIG. 5 is a schematic cross-sectional view of a horizontal light-emitting device 20.

As illustrated in FIG. 5, in a horizontal light-emitting device 20, the surface of the n-type layer 14c serves as a step surface formed in the outer peripheral portion of the light-emitting functional layer 14 of the light-emitting device 10, a cathode electrode 22 is installed on the step surface of the n-type layer 14c, and an anode electrode pad 25 is installed on an optically translucent anode electrode 24 on the surface of the p-type layer 14a. According to the horizontal light-emitting device 20, electric current flows not only in the direction normal to the light-emitting functional layer 14 but also in a horizontal direction.

Figure 6:
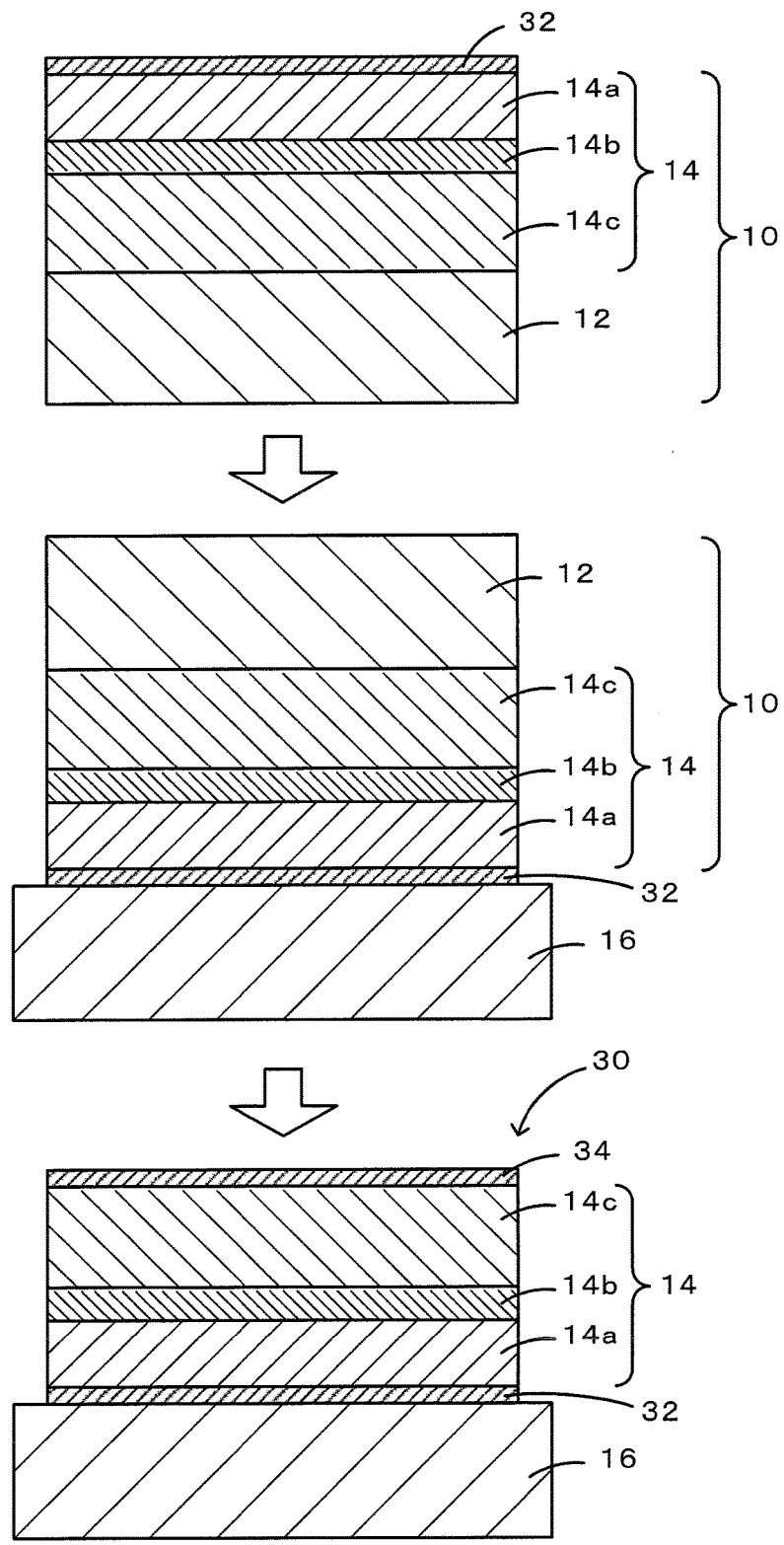
FIG. 6 includes schematic cross-sectional views illustrating a step of producing a vertical light-emitting device 30.

As illustrated in the lower part of FIG. 6, in a vertical light-emitting device 30, a cathode electrode 34 is installed on the surface of the n-type layer 14c of the light-emitting functional layer 14, and a mounting board 16 is installed on an anode electrode 32 on the surface of the p-type layer 14a. This vertical light-emitting device 30 is prepared by forming the anode electrode 32 on the surface of the p-type layer 14a of the light-emitting device 10 (the upper part of FIG. 6), joining the anode electrode 32 onto the mounting board 16 (the middle part of FIG. 6), removing the base substrate 12 by a laser lift-off method, and forming the cathode electrode 34 on the exposed surface of the n-type layer 14c. According to the vertical light-emitting device 30, electric current flows in the direction normal to the light-emitting functional layer 14. The laser lift-off method can be utilized as such because the base substrate 12 has a high in-line transmittance and high optical translucency. Moreover, the transparent alumina sintered body of the present invention can be used as not only an optical device or a base substrate for optical device but also as a substrate for epitaxial growth, an electrostatic chuck, or the like.

EXAMPLES

Experimental Example 1

1. Preparation of Alumina Sintered Body
(1) Mixing Powders and Tape Casting

A mixed alumina powder was prepared by mixing 0.9 parts by mass of a commercially available plate-like alumina powder (YFA10030 produced by KINSEI MATEC CO., LTD., average particle diameter: 10 μm, average thickness: 0.35 μm, aspect ratio: 29) and 99.1 parts by mass of a commercially available fine alumina powder (TM-DAR, average particle diameter: 0.1 μm, produced by TAIMEI CHEMICALS Co., Ltd.). When the mass ratio of the plate-like alumina powder to the fine alumina powder is expressed as T:(100−T), T=0.9. To 100 parts by mass of the mixed alumina powder, 0.0125 parts by mass (125 mass ppm) of magnesium oxide (500A produced by Ube Material Industries, Ltd.), 7.8 parts by mass of polyvinyl butyral (product number BM-2 produced by SEKISUI CHEMICAL CO., LTD.) serving as a binder, 3.9 parts by mass of di(2-ethylhexyl)phthalate (produced by KUROGANE KASEI Co., Ltd.) serving as a plasticizer, 2 parts by mass of sorbitan trioleate (RHEODOL SP-O30 produced by Kao Corporation) serving as a disperser, and 2-ethylhexanol serving as a dispersing medium were added and mixed. The amount of the dispersing medium was adjusted so that the slurry viscosity was 20000 cP. The slurry prepared as such was casted into a sheet shape by a doctor blade method on a PET film so that the thickness after drying was 20 μm. The obtained tape was cut to obtain circular sheets having a diameter of 50.8 mm (2 inches), 150 of such sheets were stacked and placed on an Al plate having a thickness of 10 mm, the resulting stack was placed in a package, and the interior of the package was vacuumed so as to prepare a vacuum packaging. The vacuum packaging was subjected to isostatic pressing at a pressure of 100 kgf/cm$^2$ in 85° C. water so as to obtain a disk-like compact.

(2) Sintering

The resulting compact was placed in a degreasing furnace and degreased under the condition of 600° C. for 10 hours. The resulting degreased body was sintered by using a graphite mold by hot pressing in nitrogen at a sintering temperature (highest attained temperature) of 1975° C. for 4 hours at a surface pressure of 200 kgf/cm$^2$ so as to obtain an alumina sintered body. As the temperature was decreased from the sintering temperature, the pressing pressure was maintained until 1200° C., and the pressing pressure was released to zero in a temperature range of lower than 1200° C.

(3) Surface Polishing

Both the front plate surface and the rear plate surface of the resulting alumina sintered body were mirror-polished with diamond abrasive grains until the thickness was 0.5 mm, and the polished sintered body (sample) was sequentially washed with acetone, ethanol, and ion exchange water in this order for 10 minutes each so as to obtain a sample for determining the degree of c-plane orientation, the in-line transmittance, and the density (observation of presence or absence of pores).

2. Properties of Alumina Sintered Body
(1) Calculation of Degree of c-Plane Orientation In order to confirm the degree of orientation of the resulting alumina sintered body, the degree of c-plane orientation was measured by XRD. An XRD profile was measured in the range of 2θ=20 to 70° by applying an X-ray to the polished surface of the mirror-polished alumina sintered body by using an XRD system (RINT-TTR III produced by Rigaku Corporation). Specifically, measurement was conducted by using a CuKα line at a voltage of 50 kV and a current of 300 mA. The degree of c-plane orientation was calculated by the Lotgering method. Specifically, the above-mentioned equations were used for calculation. The degree of c-plane orientation of the alumina sintered body of Experimental Example 1 was 100%.

(2) Rocking Curve Measurement

Figure 7:
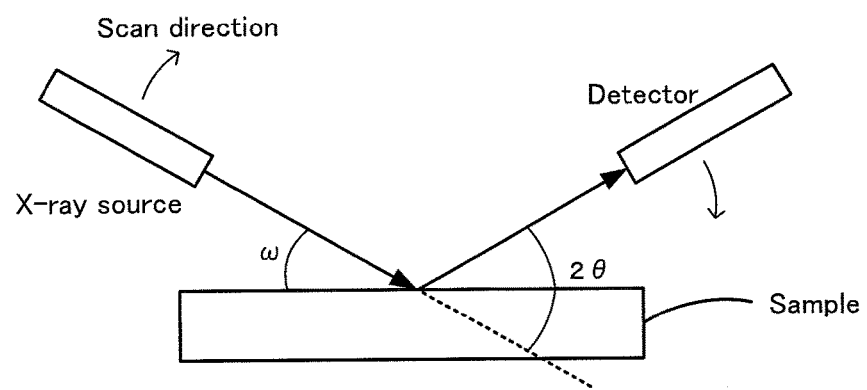
FIG. 7 is a diagram illustrating rocking curve measurement.
Figure 8:
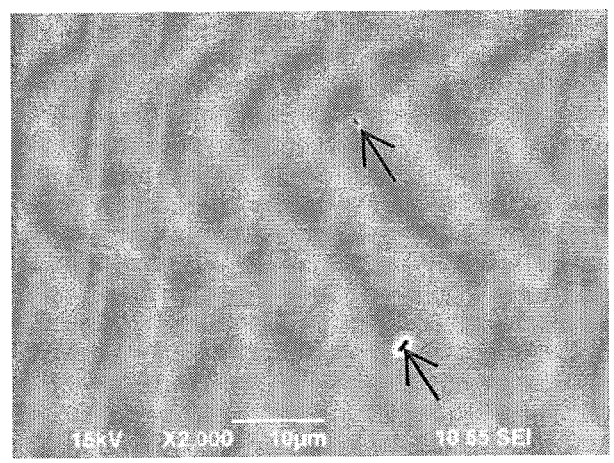
FIG. 8 is a high-magnification photograph of a polished section of an alumina sintered body.

The plate surface of the alumina sintered body (the same surface as that used in measuring the degree of c-plane orientation) was scanned by using an X-ray source and a detector moving in coordination as illustrated in FIG. 7, and the half width (XRC·FWHM) of the obtained curve was measured. Such a measurement method with which the value of 2θ (the angle formed between the detector and the incident X-ray) is fixed at the diffraction peak position and only ω (the angle formed between the sample substrate surface and the incident X-ray) is scanned is called rocking curve measurement. The system used was RINT-TTR III produced by Rigaku Corporation, and the scan range for ω was set to 3.8° to 38.8° using a cuKα line under the conditions of a voltage of 50 kV and a current of 300 mA. XRC·FWHM of the alumina sintered body of Experimental Example 1 was 3.2°.

(3) Purity (3-1) Quantitative Analysis of F

The mirror-polished alumina sintered body was analyzed by D-SIMS (IMS-6f produced by CAMECA). The measurement conditions were as follows:
Primary ion species: $Cs^+$
Primary ion acceleration energy: 14 to 15 eV
Secondary ion polarity: negative
Charge compensation: e-gun
Sputtering cycle: 100 to 500 cycles The average value between 200th to 300th sputtering cycles was used as the F content. In the quantitative analysis, a standard sample having the same composition (AlO) as that of the analysis sample and having a known concentration was measured under the same conditions as those for the analysis sample to obtain a relative sensitivity coefficient, and the quantity was determined therefrom. As a result, the F content in the sintered body was equal to or lower than the detection limit (0.1 mass ppm).

(3-2) Quantitative Analysis of Mg

After the alumina sintered body was pulverized in an alumina mortar having a purity of 99.9%, the plate-like alumina powder was dissolved by a pressure sulfuric acid decomposition method in accordance with JIS R 1649, and quantitative analysis was conducted with an inductively coupled plasma (ICP) emission spectrometer (PS3520UV-DD produced by Hitachi High-Tech Science Corporation). The Mg content of the alumina sintered body of Experimental Example 1 was detected to be 64 mass ppm.

(3-3) Quantitative Analyses of Other Elements

C and S: The C and S contents were analyzed by firing (high-frequency heating)-infrared absorption spectroscopy with a carbon/sulfur analyzer (CS844 produced by LECO JAPAN CORPORATION).

N: The N content was analyzed by an inert gas fusion-thermal conductivity method with an oxygen/nitrogen analyzer (EMGA-650W produced by HORIBA Ltd.).

H: The H content was analyzed by an inert gas fusion-nondispersive infrared absorption spectroscopy with a hydrogen analyzer (EMGA-921 produced by HORIBA Ltd.).

Other impurity elements (mainly Si, Fe, Ti, Na, Ca, Mg, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu): The plate-like alumina powder was dissolved by a pressure sulfuric acid decomposition method in accordance with JIS R 1649, and analysis was conducted with an inductively coupled plasma (ICP) emission spectrometer (PS3520UV-DD produced by Hitachi High-Tech Science Corporation).

(4) Pores

After any desired section of the resulting alumina sintered body was preliminarily polished by using diamond abrasive grains, the section was polished with a cross-section polisher (CP) (IB-09010CP produced by JEOL Ltd.). CP belongs to the category of ion milling. CP was used because grains do not detach from the polished surface. The resulting section was photographed with a scanning electron microscope (JSM-6390 produced by JEOL Ltd.). Regarding the magnification factor for observation, specifically, photographs, each having a viewing area 92.5 μm in a vertical direction and 124.0 μm in a horizontal direction, were taken at a magnification factor of 1000 and arranged in order so that the photographs formed a continuous image having a length equal to a total of four photographs in the vertical direction and a width equal to a total of three photographs in the horizontal direction (370.0 μm in the vertical direction and 372.0 μm in the horizontal direction), and the number of pores having a diameter of 0.2 to 1.0 μm was counted by visual observation. Because the magnification factor was 1000, finer pores can be identified by visual observation. The number of pores confirmed in the alumina sintered body of Experimental Example 1 was 7. The diameter of a pore was assumed to be the largest distance between two fixed points on the outer circumference of the pore.

(5) Crystal Grain Diameter

The mirror-polished alumina sintered body was placed in a high-purity alumina sheath having a purity of 99.5% by mass (capacity: 750 $cm^3$) and thermally etched in air at 1550° C. for 45 minutes. As a result of this thermal etching, the grain boundaries become clearly observable due to the difference in etching rate between the grain interior portions and the grain boundary portions. The image of the surface subjected to the thermal etching was photographed with a scanning electron microscope (JSM-6390 produced by JEOL Ltd.). The viewing area range was set as follows. That is, the size of a rectangle to be placed on the obtained image was set so that when diagonal lines were drawn, each of the diagonal lines intersected with 10 to 30 grains, and this rectangle was set to be the viewing area range. Then, for all grains that intersected with the two diagonal lines of that rectangle, the lengths of the segments on the inner side of the individual grains were determined and averaged, the average was multiplied by 1.5, and the obtained product was assumed to be the average grain diameter of the plate surface. The average grain diameter (crystal grain diameter) of the alumina sintered body of Experimental Example 1 was 44 μm.

(6) In-Line Transmittance

The resulting alumina sintered body was cut to a size of 10 mm×10 mm, and four such cut pieces were fixed onto the outermost peripheral portion of a φ68 mm metal surface plate every 90°, and lap-polished (preliminary polishing) on a SiC abrasive paper for 10 minutes with #800 and 5 minutes with #1200 while applying a load from the metal surface plate and the polishing jig only (a total of 1314 g). Subsequently, lap-polishing was performed on a ceramic surface plate with diamond abrasive grains. The lap-polishing was performed for 30 minutes with an abrasive grain size of 1 μm and then for 2 hours with an abrasive grain size of 0.5 μm. The 10 mm×10 mm×0.5 mm (thickness) sample after polishing was sequentially washed with acetone, ethanol, and ion exchange water in this order for 3 minutes each, and then the in-line transmittance at a wavelength of 300 to 1000 nm was measured by using a spectrophotometer (Lambda 900 produced by PerkinElmer Inc.). The in-line transmittance at a wavelength of 300 to 1000 nm of the alumina sintered body of Experimental Example 1 was 60.4% or more.

The production conditions and properties of the alumina sintered body of Experimental Example 1 described above are summarized in Table 1. Note that in the column of the in-line transmittance in Table 1, the minimum value of the in-line transmittance at a wavelength of 300 to 1000 nm is indicated.

TABLE 1

| Experimental Example | Plate-like particle | T*2 | Additive amount of MgO (mass ppm) | Sintering method | Pressing pressure (kg/cm²) | Sintering temperature (°C) | Retaining time (h) | Releasing temperature for pressing pressure | Degree of c-plane orientation (%) | XRC-FWHM (°) | F content (mass ppm) | Mg content (mass ppm) | Amount of impurity (mass ppm) | Number of pores | Average pore diameter (μm) | Average grain diameter of alumina sintered body (μm) | In-line transmittance (%) |
|---|---|---|---|---|---|---|---|---|---|---|---|---|---|---|---|---|---|
| 1 | YFA10030 | 0.9 | 125 | Hot pressing | 200 | 1975 | 4 | 1200 | 100.0 | 3.2 | ND*3 | 64 | P: 14 | 7 | 0.41 | 44 | 60.4 |
| 2 | YFA10030 | 0.9 | 125 | Hot pressing | 200 | 1900 | 4 | 1200 | 99.8 | 3.5 | ND*3 | 65 | P: 21 | 10 | 0.54 | 26 | 57.9 |
| 3 | YFA10030 | 0.9 | 125 | Hot pressing | 200 | 1850 | 4 | 1200 | 99.1 | 4.2 | ND*3 | 65 | P: 24 Na: 10 | 17 | 0.62 | 21 | 54.1 |
| 4 | YFA10030 | 0.7 | 125 | Hot pressing | 200 | 1975 | 4 | 1200 | 100.0 | 2.7 | ND*3 | 64 | P: 11 | 6 | 0.39 | 48 | 64.6 |
| 5 | YFA10030 | 0.35 | 125 | Hot pressing | 200 | 1975 | 4 | 1200 | 100.0 | 2.4 | ND*3 | 65 | Equal to or lower than the detection limit | 5 | 0.35 | 51 | 72.8 |
| 6 | YFA10030 | 0.1 | 125 | Hot pressing | 200 | 1975 | 4 | 1200 | 100.0 | 2.6 | ND*3 | 63 | Equal to or lower than the detection limit | 3 | 0.31 | 47 | 77.2 |
| 7 | YFA10030 | 0.05 | 125 | Hot pressing | 200 | 1975 | 4 | 1200 | 99.7 | 2.6 | ND*3 | 62 | Equal to or lower than the detection limit | 3 | 0.28 | 76 | 73.2 |
| 8 | YFA10030 | 0.05 | 125 | HIP | 1886 | 1975 | 2 | 1200 | 99.6 | 2.5 | ND*3 | 63 | Equal to or lower than the detection limit | 2 | 0.22 | 92 | 77.9 |
| 9 | YFA10030 | 0.03 | 125 | Hot pressing | 200 | 1975 | 4 | 1200 | 96.2 | 2.6 | ND*3 | 64 | Equal to or lower than the detection limit | 2 | 0.26 | 75 | 78.6 |
| 10 | YFA10030 | 0.01 | 125 | Hot pressing | 200 | 1975 | 4 | 1200 | 61.4 | 2.8 | ND*3 | 65 | Equal to or lower than the detection limit | 2 | 0.25 | 67 | 71.2 |
| 11 | YFA10030 | 0.001 | 125 | Hot pressing | 200 | 1975 | 4 | 1200 | 12.6 | 2.9 | ND*3 | 66 | Equal to or lower than the detection limit | 2 | 0.23 | 96 | 59.3 |
| 12 | YFA10030 | 0.0005 | 125 | Hot pressing | 200 | 1975 | 4 | 1200 | 1.2 | 4.3 | ND*3 | 67 | Equal to or lower than the detection limit | 1 | 0.21 | 55 | 44.2 |
| 13 | YFA10030 | 2 | 125 | Hot pressing | 200 | 1800 | 4 | 1200 | 100.0 | 4.1 | ND*3 | 65 | P: 46 Na: 19 | 26 | 1.12 | 24 | 27.2 |
| 14 | Self-manufacture | 0.15 | 500 | Hot pressing | 200 | 1850 | 4 | 1200 | 95.4 | 13.8 | ND*3 | 256 | Equal to or lower than the detection limit | 3 | 0.22 | 82 | 59.5 |
| 15 | YFA10030 | 0.9 | 125 | Hot pressing | 200 | 1800 | 4 | 1200 | 98.4 | 7.8 | ND*3 | 65 | P: 79 Na: 33 | 21 | 0.74 | 19 | 51.0 |
| 16 | YFA10030 | 0.05 | 125 | Hot pressing | 200 | 1900 | 4 | 1200 | 99.1 | 4.9 | ND*3 | 65 | Equal to or lower than the detection limit | 3 | 0.26 | 71 | 70.5 |
| 17 | YFA00610 | 0.9 | 500 | Hot pressing | 200 | 1900 | 4 | 1200 | 98.2 | 9.6 | ND*3 | 255 | Si: 60 | 4 | 0.36 | 35 | 59.4 |
| 18 | YFA00610 | 0.9 | 250 | Hot pressing | 200 | 1800 | 4 | 1200 | 91.5 | 11.7 | ND*3 | 127 | Si: 60 | 9 | 0.41 | 26 | 58.2 |
| 19 | Self-manufacture | 0.001 | 500 | Hot pressing | 200 | 1975 | 4 | 1200 | 5.5 | 4.8 | ND*3 | 256 | Equal to or lower than the detection limit | 2 | 0.2 | 178 | 59.4 |
| 20 | Self- | 1 | 500 | Hot pressing | 200 | 1800 | 4 | 1200 | 91.5 | 15.9 | ND*3 | 257 | Equal to or lower than | 4 | 0.25 | 64 | 28.5 |

TABLE 1-continued

| | Production conditions of the alumina sintered body*1 | | | | | | | Properties of the alumina sintered body | | | | | | |
|---|---|---|---|---|---|---|---|---|---|---|---|---|---|---|
| Experimental Example | Plate-like particle | T*2 | Additive amount of MgO (mass ppm) | Sintering method | Pressing pressure (kg/cm²) | Sintering temperature (°C.) | Retaining time (h) | Releasing temperature for pressing pressure | Degree of c-plane orientation (%) | XRC-FWHM (°) | F content (mass ppm) | Mg content (mass ppm) | Amount of impurity (mass ppm) | Number of pores | Average pore diameter (μm) | Average grain diameter of alumina sintered body (μm) | In-line transmittance (%) |
| 21 | Self-manufacture | 0.0005 | 500 | Hot pressing | 200 | 1975 | 4 | 1200 | 1.4 | 6.2 | ND*3 | 256 | Equal to or lower than the detection limit | 1 | 0.23 | 195 | 48.0 |
| 22 | Self-manufacture | 0.0005 | 500 | Hot pressing | 200 | 2000 | 4 | 1200 | 5.9 | 4.6 | ND*3 | 256 | Equal to or lower than the detection limit | 2 | 0.21 | 211 | 49.0 |

*1The sintering atmosphere is a nitrogen atmosphere.
*2T indicates the % by mass of the plate-like alumina powder in the mixed alumina powder.
*3ND indicates that equal to or lower than the detection limit.

Experimental Examples 2 to 13

In Experimental Examples 2 to 13, alumina sintered bodies were prepared in accordance with Experimental Example 1 but under the alumina sintered body production conditions indicated in Table 1. Specifically, in Experimental Examples 2 and 3, alumina sintered bodies were prepared as in Experimental Example 1 except that the sintering temperature was changed to 1900° C. and 1850° C., respectively. In Experimental Examples 4 to 7 and 9 to 12, alumina sintered bodies were prepared as in Experimental Example 1 except that T (the % by mass of the plate-like alumina powder in the mixed alumina powder) was changed to the values indicated in Table 1. In Experimental Example 8, an alumina sintered body was obtained by HIP sintering under the conditions of a sintering temperature of 1975° C. for 2 hours and a surface pressure of 1886 kgf/cm². In HIP sintering, after 1975° C. was retained, the temperature was decreased while a pressure as high as a surface pressure of 1000 kgf/cm² or higher was retained until 1200° C. In Experimental Example 13, an alumina sintered body was prepared as in Experimental Example 1 except that T was changed to 2 and the sintering temperature was set to 1800° C. The properties of 2.(1) to (5) mentioned above of these alumina sintered bodies were determined. The results are indicated in Table 1.

Experimental Examples 14 to 22

In Experimental Examples 14 to 22, alumina sintered bodies were prepared in accordance with Experimental Example 1 but under the alumina sintered body production conditions indicated in Table 1.

In Experimental Examples 14 and 19 to 22, a plate-like alumina powder was prepared under the production conditions described below, and mixed with a fine alumina powder in preparing a sintered body. Ninety-six parts by mass of high-purity γ-alumina (TM-300D produced by TAIMEI CHEMICALS Co., Ltd.), 4 parts by mass of high-purity AlF$_3$ (special grade Shika produced by Kanto Chemical Co., Inc.), and 0.17 parts by mass of high-purity α-alumina (TM-DAR produced by TAIMEI CHEMICALS Co., Ltd., D50=1 μm) serving as seed crystals were mixed in a pot mill for 5 hours using ϕ2 mm alumina balls with isopropyl alcohol (IPA) serving as a solvent. The total of the mass ratios of the impurity elements other than F, H, C, and S in the resulting mixed powder was 1000 ppm or less. Into a high-purity alumina sheath (capacity: 750 cm³) having a purity of 99.5% by mass, 300 g of the resulting mixed raw material powder was placed, a high-purity alumina lid having a purity of 99.5% by mass was placed, and a heat treatment was conducted in an electric furnace under air flow at 900° C. for 3 hours. The air flow rate was set to 25000 cc/min. The heat-treated powder was annealed in air at 1150° C. for 40 hours, and then the annealed powder was pulverized with ϕ2 mm alumina balls for 4 hours to obtain a plate-like alumina powder having an average particle diameter of 2 μm, an average thickness of 0.2 μm, and an aspect ratio of 10. The average particle diameter and the average thickness of the particles were determined by observing arbitrarily selected one hundred particles in the plate-like alumina powder by using a scanning electron microscope (SEM). The average particle diameter is the average of the long axis lengths of the particles, the average thickness is the average of the short axis lengths of the particles, and the aspect ratio is average particle diameter/average thickness. The resulting plate-like alumina powder was α-alumina.

In Experimental Example 17 and 18, a commercially available plate-like alumina powder (YFA00610 produced by KINSEI MATEC CO., LTD., average particle diameter: 0.6 μm, average thickness: 0.06 μm, aspect ratio: 10) was used to prepare a sintered body. The properties of 2.(1) to (5) mentioned above of these alumina sintered bodies were determined. The results are indicated in Table 1.

[Evaluation]

In all of the alumina sintered bodies of Experimental Examples 1 to 11 and 14 to 19, the degree of c-plane orientation was 5% or more, the XRC half width was 15.0° or less, the F content was equal to or lower than the detection limit, the crystal grain diameter was 15 to 200 μm, and the number of pores having a diameter of 0.2 to 1.0 μm was 25 or less. When the thicknesses of the alumina sintered bodies obtained in these Experimental Examples were set to 0.5 mm, the in-line transmittance at a wavelength of 300 nm to 1000 nm was 50% or more; thus, the in-line transmittance was high and the transparency was excellent. Although the reason behind achieving such excellent transparency is not clear, it is presumed that the degree of c-plane orientation, the XRC half width, the F content, the crystal grain diameter, and the number of pores having a diameter of 0.2 to 1.0 μm all have taken appropriate values and contributed to the result when combined.

In Experimental Examples 1, 2, 4 to 11, 14, and 16 to 19, the degree of c-plane orientation was 5% or more, the XRC half width was 15.0° or less, the crystal grain diameter was 20 to 200 μm, and the number of pores having a diameter of 0.2 to 1.0 μm was 10 or less. When the thicknesses of the alumina sintered bodies obtained in these Experimental Examples were set to 0.5 mm, the in-line transmittance at a wavelength of 300 nm to 1000 nm was 55% or more; thus, the transparency was superior.

Furthermore, in Experimental Examples 1, 4 to 10, and 16, the degree of c-plane orientation was 60% or more, the XRC half width was 5.0° or less, the crystal grain diameter was 45 to 95 μm, and the number of pores having a diameter of 0.2 to 1.0 μm was 7 or less. When the thicknesses of the alumina sintered bodies obtained in these Experimental Examples were set to 0.5 mm, the in-line transmittance at a wavelength of 300 nm to 1000 nm was 60% or more; thus, the transparency was even more excellent. Among these, the alumina sintered body of Experimental Example 9 had an in-line transmittance of 78% or more, which is outstanding compared to others.

In contrast, in Experimental Example 12, the degree of c-plane orientation was as low as 1.2% (less than 5%) and in Experimental Example 13, the number of pores was as large as 26; thus, the in-line transmittance was low in these examples. In Experimental Example 20, the XRC half width was as large as 15.9° (more than 15°); in Experimental Example 21, the degree of c-plane orientation was as low as 1.4% (less than 5%); and in Experimental Example 22, the average grain diameter of the sintered body was as large as 211 μm (more than 200 μm). Thus, the in-line transmittance was low in these examples.

Note that Experimental Examples 1 to 11 and 14 to 19 correspond to the examples of the present invention, and Experimental Examples 12, 13, and 20 to 22 correspond to the comparative examples. Naturally, the present invention is not limited by the above-described experimental examples and various other modifications can be implemented without departing from the technical scope of the present invention.

The present application claims priority from Japanese Patent Application No. 2015-193943, filed on Sep. 30, 2015, the entire contents of which are incorporated herein by reference.

What is claimed is:

1. An alumina sintered body having:
   a degree of c-plane orientation of 5% or more, which is determined by a Lotgering method using an X-ray diffraction profile in a range of 2θ=20° to 70° obtained under X-ray irradiation, and an XRC half width of 15.0° or less in rocking curve measurement;
   an F content of less than 0.99 mass ppm when measured by D-SIMS;
   a crystal grain diameter of 15 to 200 μm; and
   25 or less pores having a diameter of 0.2 μm to 1.0 μm when a photograph of a viewing area 370.0 μm in a vertical direction and 372.0 μm in a horizontal direction taken at a magnification factor of 1000 is visually observed.

2. The alumina sintered body according to claim 1, wherein, the F content is 0.1 mass ppm or less.

3. The alumina sintered body according to claim 1, wherein, the crystal grain diameter is 20 to 200 μm.

4. The alumina sintered body according to claim 1, wherein, the number of the pores is 15 or less.

5. The alumina sintered body according to claim 1, wherein, the F content is 0.1 mass ppm or less, the crystal grain diameter is 20 to 200 μm, and the number of the pores is 10 or less.

6. The alumina sintered body according to claim 5, wherein, the degree of c-plane orientation is 60% or more, and the XRC half width is 5.0° or less, the crystal grain diameter is 40 to 95 μm, and the number of the pores is 7 or less.

7. The alumina sintered body according to claim 6, wherein, the crystal grain diameter is 45 to 95 μm, and the number of the pores is 5 or less.

8. The alumina sintered body according to claim 7, wherein, the degree of c-plane orientation is 96% or more, and the XRC half width is 2.6° or less, and the number of the pores is 3 or less.

9. The alumina sintered body according to claim 1, wherein, the alumina sintered body having a thickness of 0.5 mm has an in-line transmittance of 78% or more at 300 to 1000 nm.

10. A base substrate for optical device, comprising the alumina sintered body according to claim 1.

* * * * *